(12) United States Patent
Lee et al.

(10) Patent No.: US 9,196,876 B2
(45) Date of Patent: Nov. 24, 2015

(54) TOUCH SCREEN INTEGRATED ORGANIC LIGHT EMITTING DISPLAY DEVICE AND METHOD FOR FABRICATING THE SAME

(71) Applicant: LG Display Co., Ltd., Seoul (KR)

(72) Inventors: Jae-Do Lee, Gumi-si (KR); Ho-Won Choi, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/582,684

(22) Filed: Dec. 24, 2014

(65) Prior Publication Data

US 2015/0155526 A1    Jun. 4, 2015

Related U.S. Application Data

(62) Division of application No. 13/592,207, filed on Aug. 22, 2012, now Pat. No. 8,946,690.

(30) Foreign Application Priority Data

Dec. 7, 2011    (KR) ......................... 10-2011-0130621

(51) Int. Cl.
*H01L 21/30*    (2006.01)
*H01L 51/56*    (2006.01)
(Continued)

(52) U.S. Cl.
CPC .............. *H01L 51/56* (2013.01); *G06F 3/0412* (2013.01); *H01L 27/323* (2013.01); *H01L 27/3244* (2013.01); *G06F 2203/04103* (2013.01)

(58) Field of Classification Search
CPC ........... G06F 3/041; B32B 7/12; H01L 51/52; H01L 33/48; H01L 51/56; H01L 27/32

USPC ................ 438/27, 34, 458; 257/E33.055, 40; 345/173, 174; 313/504, 506

See application file for complete search history.

(56) References Cited

U.S. PATENT DOCUMENTS 8,237,354 B2 *   8/2012   Kim et al. ....................... 313/504
8,243,034 B2 *   8/2012   Kim .............................. 345/173

(Continued)

FOREIGN PATENT DOCUMENTS

| CN | 101322233 | 12/2008 |
| CN | 101626017 | 1/2010 |
| CN | 102096221 | 6/2011 |

OTHER PUBLICATIONS

State Intellectual Property Office of the People's Republic of China, First Office Action, Chinese Patent Application No. 201210303668.4, Jan. 30, 2015, twenty-six pages.

*Primary Examiner* — Caleb Henry
(74) *Attorney, Agent, or Firm* — Fenwick & West LLP

(57) ABSTRACT

Disclosed are a touch screen integrated organic light emitting display device which has a thin profile and is implemented in a flexible type and a method for fabricating the same. The touch screen integrated organic light emitting display device includes a film substrate, a first etch stopper layer and a first buffer layer sequentially formed on the film substrate, a thin film transistor array including thin film transistors formed on the first buffer layer, organic light emitting diodes connected to the thin film transistors, a passivation layer covering the thin film transistor array and the organic light emitting diodes, a touch electrode layer contacting the passivation layer, a second buffer layer and a second etch stopper layer sequentially formed on the touch electrode layer, and a polarizing plate formed on the second etch stopper layer.

12 Claims, 6 Drawing Sheets

(51) Int. Cl.
  *G06F 3/041* (2006.01)
  *H01L 27/32* (2006.01)

(56) References Cited

U.S. PATENT DOCUMENTS

| | | | | |
|---|---|---|---|---|
| 8,599,149 B2* | 12/2013 | Lee et al. | | 345/173 |
| 8,749,515 B2* | 6/2014 | Kim et al. | | 345/174 |
| 2004/0080267 A1 | 4/2004 | Cok | | |
| 2005/0269962 A1* | 12/2005 | Matsunaga | | 315/169.3 |
| 2007/0138941 A1* | 6/2007 | Jin et al. | | 313/503 |
| 2008/0079697 A1* | 4/2008 | Lee et al. | | 345/173 |
| 2008/0218064 A1* | 9/2008 | Cho et al. | | 313/504 |
| 2008/0308231 A1* | 12/2008 | Lee et al. | | 156/379.8 |
| 2009/0278452 A1* | 11/2009 | Kim | | 313/504 |
| 2010/0019667 A1* | 1/2010 | Park et al. | | 313/504 |
| 2010/0045576 A1* | 2/2010 | Park et al. | | 345/76 |
| 2010/0052521 A1* | 3/2010 | Kim et al. | | 313/504 |
| 2010/0123672 A1* | 5/2010 | Kim | | 345/173 |
| 2010/0156282 A1* | 6/2010 | Park et al. | | 313/504 |
| 2010/0176382 A1* | 7/2010 | Park et al. | | 257/40 |
| 2010/0244005 A1* | 9/2010 | Gyoda | | 257/40 |
| 2010/0309150 A1* | 12/2010 | Lee et al. | | 345/173 |
| 2011/0074729 A1* | 3/2011 | Im et al. | | 345/174 |
| 2011/0080372 A1* | 4/2011 | Lee et al. | | 345/174 |
| 2011/0102365 A1* | 5/2011 | Park et al. | | 345/174 |
| 2011/0163980 A1* | 7/2011 | Kwon et al. | | 345/173 |
| 2011/0164210 A1* | 7/2011 | Tsuda | | 349/96 |
| 2011/0291994 A1* | 12/2011 | Kwak et al. | | 345/176 |
| 2011/0304564 A1* | 12/2011 | Kim et al. | | 345/173 |
| 2011/0316802 A1* | 12/2011 | Choi | | 345/173 |
| 2012/0007106 A1* | 1/2012 | Jung et al. | | 257/88 |
| 2012/0098422 A1* | 4/2012 | Jung et al. | | 313/512 |
| 2012/0162096 A1* | 6/2012 | Lin et al. | | 345/173 |
| 2012/0229717 A1* | 9/2012 | Kim et al. | | 349/12 |
| 2012/0256861 A1* | 10/2012 | Park | | 345/173 |
| 2013/0002569 A1* | 1/2013 | Kang et al. | | 345/173 |
| 2014/0009439 A1* | 1/2014 | Konicek | | 345/174 |
| 2014/0085222 A1* | 3/2014 | Park et al. | | 345/173 |
| 2014/0192277 A1* | 7/2014 | Yilmaz et al. | | 349/12 |

* cited by examiner

TOUCH SCREEN INTEGRATED ORGANIC LIGHT EMITTING DISPLAY DEVICE AND METHOD FOR FABRICATING THE SAME

CROSS-REFERENCE TO RELATED APPLICATION

This application is a divisional of U.S. patent application Ser. No. 13/592,207 filed on Aug. 22, 2012 which claims priority under 35 U.S.C. §119(a) to Korean Patent Application No. 10-2011-0130621, filed on Dec. 7, 2011, each of which is hereby incorporated by reference in its entirety.

BACKGROUND

1. Technical Field

The following description relates to an organic light emitting display device, and more particularly, to a touch screen integrated organic light emitting display device which has a thin profile and is implemented in a flexible type, and a method for fabricating the same.

2. Discussion of the Related Art

As examples of flat display devices, there are liquid crystal display devices (LCDs), organic light emitting display devices, plasma display panel devices (PDPs), quantum dot display devices, field emission display devices (FEDs), electrophoretic display devices (EPDs), etc. Each of these flat display devices essentially includes a flat display panel for displaying an image in which a pair of transparent insulating substrates facing each other is bonded to each other, with an intrinsic light emitting layer, a polarizing layer or other optical material layers being interposed there between.

In an organic light emitting display device among these flat display devices, as requirement for a flat display element having a small space occupation is increased according to a recent large-sized trend of display devices, an organic electric field light emitting device referred to as an organic light emitting diode (OLED) has been rapidly developed as one of the flat display devices and various sample products have come into the market.

The organic light emitting display device does not require a separate light source and includes organic light emitting diodes spontaneously emitting light in the unit of pixels. The organic light emitting display device is considered the next generation display device since a light source and a structure to assemble the light source to a display panel are not required.

In the organic light emitting display device, electrons and holes are injected into a light emitting layer from an electron injection electrode (a cathode) and a hole injection electrode (an anode), respectively when a voltage is applied across the electron injection electrode (a cathode) and the hole injection electrode (an anode), and excitons, which are formed when the injected electrons and holes are combined, emit light when they transition from an excited state to a ground state.

Further, the requirement that a touch panel, which can recognize a touch point contacted by a human hand or other input unit and transmit the information concerning the contact, be added to the above display device has increased. Recently, such a touch panel attached to the external surface of the display device is employed.

Touch panels are divided into a resistive type, a capacitive type, and an infrared sensing type. Presently, the capacitive type touch panel is better than other types of touch panels in terms of fabrication and sensitivity.

Hereinafter, a conventional organic light emitting display device to which a touch screen is attached will be described with reference to the accompanying drawings.

FIG. 1 is a cross-sectional view illustrating a conventional organic light emitting display device to which a touch screen is attached.

As shown in FIG. 1, the conventional organic light emitting display device includes an organic light emitting display panel 10, a touch screen 20 and a cover glass 30 which are sequentially stacked, and first and second adhesive layers 15 and 25 are provided between the light emitting display panel 10 and the touch screen 20 and between the touch screen 20 and the cover glass 30, respectively.

Although not illustrated in FIG. 1, the organic light emitting display panel 10 includes a substrate, a thin film transistor array arranged on the substrate in a form of matrix, and organic light emitting diodes connected to respective thin film transistors of the thin film transistor array. A passivation film and a polarizing layer are further provided (not shown) to cover the thin film transistor array. In this case, the first adhesive layer 15 is disposed on the upper surface of the polarizing layer.

The above-described conventional organic light emitting display device to which the touch screen is attached has the following problems.

First, if the organic light emitting display panel 10 and the touch screen 20 are separately formed and then the touch screen 20 is attached to the organic light emitting display panel 10, a cover glass 30 to protect the touch screen 20 is required, and the total thickness of the touch screen 20 including the stacked cover glass 30 and the organic light emitting display panel 10 is increased and thus it is difficult to implement the organic light emitting display device having a thin profile in a flexible type.

Second, since the organic light emitting display panel 10 and the touch screen 20 are separately formed, a process for forming the organic light emitting display panel 10 and a process for forming the touch screen 20 are required and thereby yield is low and cost is high.

Third, a polarizing plate optically blocking external light (not shown) is provided on the upper surface of the organic light emitting display panel 10, and thereby, when the touch screen 20 is formed thereon, an electrode pattern in the touch screen may be visible.

SUMMARY

Accordingly, the embodiments of this application are directed to a touch screen integrated organic light emitting display device and a method for fabricating the same.

An object of the embodiments of this application are to provide a touch screen integrated organic light emitting display device which has a thin profile and is implemented in a flexible type and a method for fabricating the same.

To achieve this object and other advantages, as embodied and broadly described herein, a touch screen integrated organic light emitting display device includes a film substrate, a first etch stopper layer and a first buffer layer sequentially formed on the film substrate, a thin film transistor array including thin film transistors formed on the first buffer layer, organic light emitting diodes connected to the thin film transistors, a passivation layer covering the thin film transistor array and the organic light emitting diodes, a touch electrode layer contacting the passivation layer, a second buffer layer and a second etch stopper layer sequentially formed on the touch electrode layer, and a polarizing plate formed on the second etch stopper layer.

The film substrate may be formed of a plastic insulating film.

The first etch stopper layer and the second etch stopper layer may be formed of polyimide or photo acryl.

Further, the first buffer layer and the second buffer layer may be formed of a plurality of layers of inorganic films. For example, the plurality of layers of inorganic films may be formed by depositing at least one of an oxide layer ($SiO_2$) and at least one of a nitride layer ($SiN_x$).

The touch electrode layer may include first touch electrodes and second touch electrodes intersecting each other and touch pad electrodes respectively transmitting signals to the first and second touch electrodes. The touch pad electrodes may be connected to dummy metal formed in the same layer as the thin film transistor array. In this case, the touch pad electrodes and the dummy metal may be connected by applying a sealant including conductive metal balls. Further, the conductive metal balls may include gold (Au) or silver (Ag).

The first buffer layer may protrude more outwardly than the touch electrode layer. A touch drive integrated circuit (IC) for transmitting and receiving signals to and from the first touch electrodes and the second touch electrodes and an OLED IC for transmitting signals to the thin film transistor array and the organic light emitting diodes may be provided at a portion of the first buffer layer protruding more outwardly than the touch electrode layer.

Here, the touch drive IC and the OLED IC may be connected to a flexible printed circuit formed at the portion of the first buffer layer protruding more outwardly than the touch electrode layer.

The touch screen integrated organic light emitting display device may further include a transparent cover covering the polarizing plate. In this case, the transparent cover may be formed of a transparent insulating film or a glass.

The first buffer layer, the first etch stopper layer and the film substrate may have the same first width, the touch electrode layer, the second buffer layer and the second etch stopper layer may have the same second width, and the first width may be greater than the second width.

In another aspect, a method for fabricating a touch screen integrated organic light emitting display device includes sequentially forming a first etch stopper layer, a first buffer layer, a thin film transistor array including thin film transistors, organic light emitting diodes connected to the thin film transistors, and a passivation layer covering the thin film transistor array and the organic light emitting diodes, on a first substrate, sequentially forming a second etch stopper layer, a second buffer layer, and a touch electrode layer, on a second substrate, attaching the touch electrode layer to the passivation layer such that the touch electrode layer and the passivation layer are opposite each other, removing the first substrate and the second substrate; and attaching a film substrate to a surface of the first etch stopper layer which is exposed after the removal of the first substrate.

The method may further include attaching a polarizing plate to a surface of the second etch stopper layer which is exposed after the removal of the second substrate.

The step of removing the first substrate and the second substrate may be carried out by etching or irradiating a laser to the first substrate and the second substrate.

The step of forming the first buffer layer and the second buffer layer may be carried out by depositing at least one of an oxide layer ($SiO_2$) and at least one of a nitride layer ($SiN_x$).

The first substrate may protrude more outwardly than the second substrate.

The step of forming the touch electrode layer may include forming first touch electrodes and second touch electrodes intersecting each other and touch pad electrodes respectively transmitting signals to the first and second touch electrodes. In this case, in the step of attaching the touch electrode layer to the passivation layer, the touch pad electrodes may be connected to dummy metal formed in the same layer as the thin film transistor array. The touch pad electrodes and the dummy metal may be connected by applying a sealant including conductive metal balls.

The step of attaching the film substrate to the surface of the first etch stopper layer may be carried out by intervening an adhesive layer between the first etch stopper layer and the film substrate.

The method may further include providing a touch drive IC for transmitting and receiving signals to and from the first touch electrodes and the second touch electrodes and an OLED IC for transmitting signals to the thin film transistor array and the organic light emitting diodes at a portion of the first buffer layer protruding more outwardly than the touch electrode layer. The method may further include forming a flexible printed circuit at the portion of the first buffer layer protruding more outwardly than the touch electrode layer, wherein the flexible printed circuit is to be connected to the touch drive IC and the OLED IC.

The features and advantages described in this summary and the following detailed description are not intended to be limiting. Many additional features and advantages will be apparent to one of ordinary skill in the art in view of the drawings, specification and claims.

BRIEF DESCRIPTION OF THE DRAWINGS

The accompanying drawings, which are included to provide a further understanding of the invention and are incorporated in and constitute a part of this specification, illustrate embodiment(s) of the invention and together with the written description serve to explain the principle of the invention. In the drawings.

DETAILED DESCRIPTION OF THE INVENTION

Figure 1:
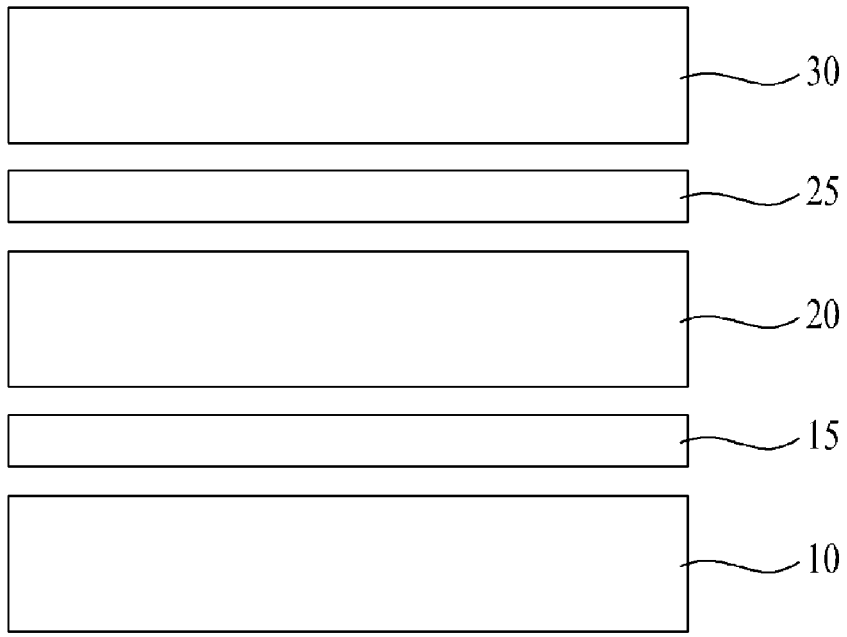
FIG. 1 is a cross-sectional view illustrating a conventional organic light emitting display device to which a touch screen is attached.

The invention will be described more fully hereinafter with reference to the accompanying drawings, in which example embodiments of the invention are shown. This invention may, however, be embodied in many different forms and should not be construed as limited to the embodiments set forth herein. Like reference numerals designate like elements throughout the specification. In the following description, if it is decided that the detailed description of known function or configuration related to the invention makes the subject matter of the invention unclear, the detailed description is omitted.

Figure 2:
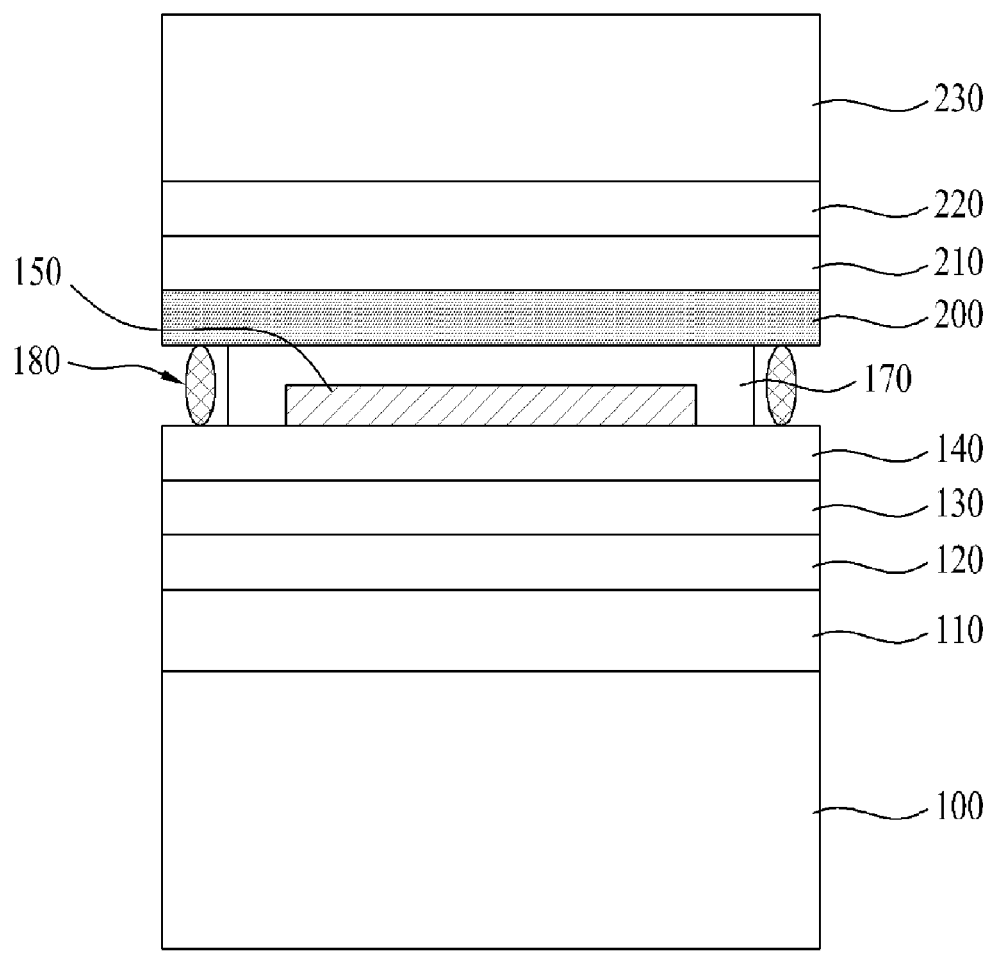
FIG. 2 is a cross-sectional view illustrating a touch screen integrated organic light emitting display device in accordance with one embodiment.

FIG. 2 is a cross-sectional view illustrating a touch screen integrated organic light emitting display device in accordance with one embodiment.

As shown in FIG. 2, the touch screen integrated organic light emitting display device in accordance with one embodiment includes a film substrate 100, a first etch stopper layer 120 and a first buffer layer 130 sequentially formed on the film substrate 100, a thin film transistor array 140 formed on the first buffer layer 130 and including thin film transistors arranged in a form of a matrix to define pixels, organic light emitting diodes 150 connected to the thin film transistors of the respective pixels, a passivation layer 170 covering the thin film transistor array 140 and the organic light emitting diodes 150, a touch electrode layer 200 formed on the passivation layer 170, a second buffer layer 210 and a second etch stopper layer 220 sequentially formed on the touch electrode layer 200, and a polarizing plate 230 formed on the second etch stopper layer 220.

Such a touch screen integrated organic light emitting display device in accordance with one embodiment does not use a glass substrate having the largest thickness, i.e., about 0.7 mm, in the display device and may thus have a thin profile. Instead, the touch screen integrated organic light emitting display device in accordance with one embodiment uses the film substrate 100 formed as a plastic insulating film as a substrate for supporting the thin film transistor array 140, the organic light emitting diodes 150 and the touch electrode layer 200 and may thus be implemented as a flexible display device which can be warped or bent.

Further, since the film substrate 100 may be thermally expanded due to the heat transferred from the equipment for depositing or patterning during an array formation process of forming the thin film transistor array 140, the organic light emitting diodes 150 and the touch electrode layer 200, the array formation process may not be normally carried out. In order to prevent such a problem, the buffer layers 130 and 210 and the etch stopper layers 120 and 220 are formed on glass substrates before the thin film transistor array 140 and the touch electrode layer 200 are formed, and the array formation process is carried out by loading the glass substrates with the depositing or patterning equipment.

Here, the first and second etch stopper layers 120 and 220 are provided to prevent damage caused by an etching solution or laser irradiation during a removal process of the glass substrates. For example, the first etch stopper layer 120 and the second etch stopper layer 220 may be formed of polyimide or photo acryl.

Both of the first and second etch stoppers 120 and 220 may have a thickness of about 1 μm to 10 μm.

The first buffer layer 130 and the second buffer layer 210 are provided to prevent oxygen or moisture from permeating into the organic films formed on the organic light emitting diodes 150, and function as barriers to block external air or moisture entering from the outside.

Further, the first buffer layer 130 and the second buffer layer 210 are formed of a plurality of layers of inorganic films. For example, the plurality of layers of inorganic films may be formed by depositing $SiN_x$ and $SiO_2$. It is confirmed from experimentation that permeation of external air or moisture is prevented when two or more layers like the first buffer layer 130 and the second buffer layer 210 are deposited and each of them has a thickness of about 5,000 Å to 6,500 Å. The total thickness of the first buffer layer 130 and second buffer layer 210 is less than 1 μm so as not to increase the thickness of the touch screen integrated display device.

The touch electrode layer 200 includes first touch electrodes (not shown) and second touch electrodes (not shown) intersecting each other, and touch pad electrodes (not shown) respectively transmitting signals to the first and second touch electrodes. The touch pad electrodes may be connected to dummy metal formed on the thin film transistor array 140. Although FIG. 2 illustrates one layer of the thin film transistor array 140 which includes the dummy metal and one touch electrode layer 200 which includes the touch pad electrodes and the first and second touch electrodes, the first and second touch electrodes intersect each other. The respective electrodes may be patterned separately.

Here, the first and second touch electrodes may be formed of transparent conductive materials as transparent electrodes, and the touch pad electrodes may be formed of light shielding metal material having high conductivity. Further, the first and second touch electrodes may be formed in the same layer, or may be formed in different layers. For example, if the first and second touch electrodes are formed in the same layer, separate connection patterns are provided at the intersections of the first and second touch electrodes so as to prevent a short between the first and second touch electrodes.

The thin film transistor array 140 includes gate lines and data lines intersecting each other to define pixel areas and thin film transistors formed at the intersections of the gate lines and the data lines, and the pixel areas are thus arranged in a form of a matrix. The dummy metal is formed in the same layer as the gate lines or the data lines and at the side of OLED pads outside of the pixel areas.

The touch pad electrodes are located at the edge of the touch electrode layer, and the touch pad electrodes and the dummy metal are formed at the corresponding positions in the vertical direction and are connected by a sealant including conductive metal balls 180.

Here, the conductive metal balls 180 may include Au or Ag.

The polarizing plate 230 is attached to the surface of the second etch stopper layer 220 which is exposed after removal of a glass substrate from the second etch stopper layer 220, and the polarizing plate 230 may be attached to the second etch stopper layer 220 by using a separate adhesive layer (not shown) or may directly contact the second etch stopper layer 220 without an adhesive layer if the polarizing plate 230 has an adhesive surface.

In this case, the polarizing plate 230 is located on the upper surface of the touch electrode layer 200 so as to cover the touch electrode layer 200, and an electrode pattern within the touch electrode layer 200 is invisible.

Further, the film substrate 100 is attached to the surface of the first etch stopper 120 which is exposed after removal of a glass substrate from the first etch stopper 120, and the film substrate 100 may be formed on the rear surface of the first etch stopper 120 by intervening an adhesive layer 110 therebetween.

Here, the film substrate 100 has a thickness that is less than 200 μm so that the touch screen integrated organic light emitting device may be sufficiently warped or bent.

The passivation film 170 covering the thin film transistor array 140 and the organic light emitting diodes 150 is formed not to cover pad parts of the thin film transistor array 140 where dummy metal is formed.

Each of the organic light emitting diodes 150 may include a first electrode and a second electrode opposite each other and a light emitting layer formed between the first and second electrodes, and may further include a common layer of an organic material formed between the respective electrodes and the light emitting layer, as needed. Here, the first electrode may be connected to the thin film transistor, and the second electrode may receive a signal from the dummy metal.

Hereinafter, with reference to the accompanying drawings, a method for fabricating the touch screen integrated organic light emitting display device in accordance with the present invention will be described.

FIGS. 3A to 3E are cross-sectional views of the touch screen integrated organic light emitting display device illustrating the method for fabricating the touch screen integrated organic light emitting display device in accordance with one embodiment.

In the description below, components and thicknesses of the respective layers are the same as those of the above-described organic light emitting display device, and a detailed description thereof will thus be omitted.

Figure 3A:
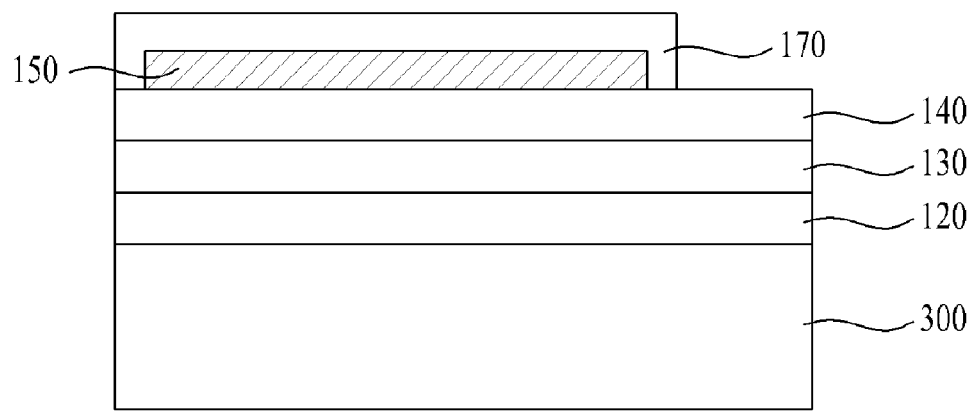
FIGS. 3A to 3E are cross-sectional views illustrating a method for fabricating the touch screen integrated organic light emitting display device in accordance with one embodiment.

As shown in FIG. 3A, the first etch stopper layer 120, the first buffer layer 130, the thin film transistor array 140, the organic light emitting diodes 150 connected to the thin film transistors in the thin film transistor array 140, and the passivation layer 170 covering the thin film transistor array 140 and the organic light emitting diodes 150 are sequentially formed on a first substrate 300. Herein, the passivation layer 170 may have adhesive property.

Here, the first substrate 300 may be a glass substrate and serves to support the first etch stopper layer 120 and the first buffer layer 130 so as to prevent the first etch stopper layer 120 and the first buffer layer 130 from being bent, so that the depositing or patterning equipment loading the glass substrate during formation of the thin film transistor array 140 and the organic light emitting diodes 150 may form a pattern at a correct position.

Further, dummy metal (not shown) is further formed at the pad parts corresponding to the edge of the first buffer layer 130 during the thin film transistor array 140 is formed.

Figure 3B:
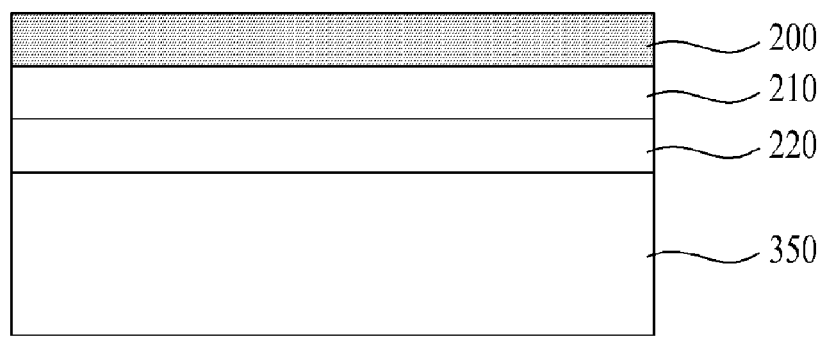

Thereafter, as shown in FIG. 3B, the second etch stopper layer 220, the second buffer layer 210, and the touch electrode layer 200 are sequentially formed on a second substrate 350. The second substrate 350 may be a glass substrate. Here, the touch electrode layer 200 may include first touch electrodes and second touch electrodes intersecting each other and touch pad electrodes respectively transmitting signals to the first and second touch electrodes. If the first touch electrodes and the second touch electrodes are formed in different layers, an insulating film may be further provided between the layers.

The first and second buffer layers 130 and 210 are respectively formed by depositing at least one of an oxide layer ($SiO_2$) and at least one of a nitride layer ($SiN_x$). The first and second buffer layers 130 and 210 function as barriers to prevent external moisture or air from permeating into the organic light emitting diodes 150 during processes of bonding the second substrate 350 to the first substrate 300.

Although the drawings illustrate that the first substrate 300 and the second substrate 350 have the same size, the first substrate 300 actually has a size protruding more outwardly than the second substrate 350. Further, a drive IC and a flexible printed circuit board electrically connected to the drive IC are connected to the protruding portion of the first substrate 300 during a subsequent circuit mounting process (with reference to FIGS. 4 and 5).

Figure 3C:
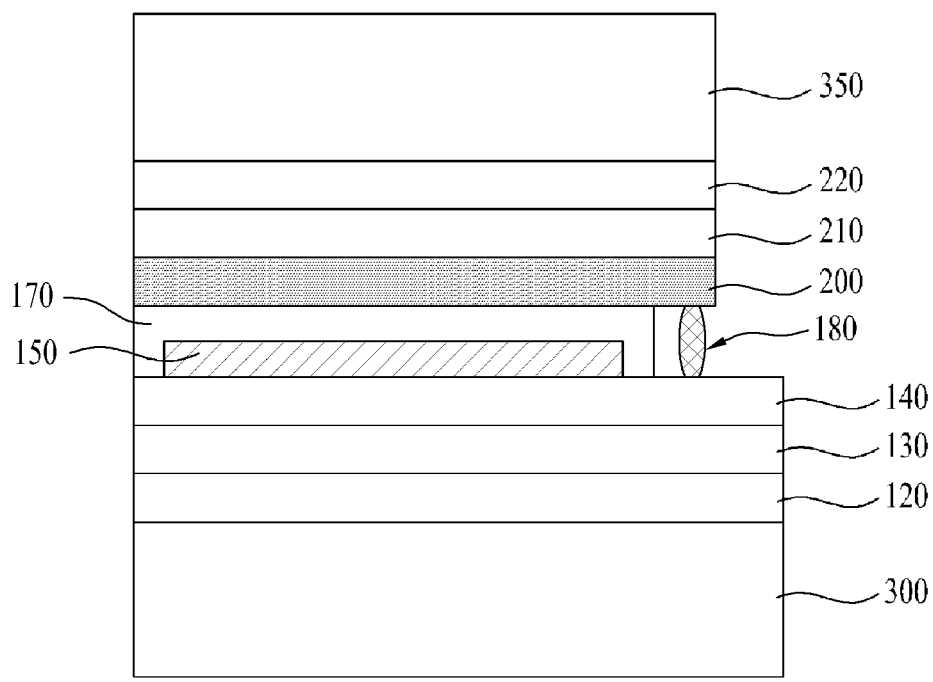

Thereafter, as shown in FIG. 3C, the touch electrode layer 200 is attached to the passivation layer 170 opposite the touch electrode layer 200 and simultaneously, the sealant including the conductive metal balls 180 is applied to the dummy metal or the touch pad electrodes, thereby bonding the dummy metal and the touch pad electrodes to each other. When the touch electrode layer 200 is attached to the passivation layer 170, in addition to the use of the sealant, adhesiveness of the passivation layer 170 may be used, or an additional adhesive layer or adhesive agent may further be intervened between the touch electrode layer 200 and the passivation layer 170.

Figure 3D:
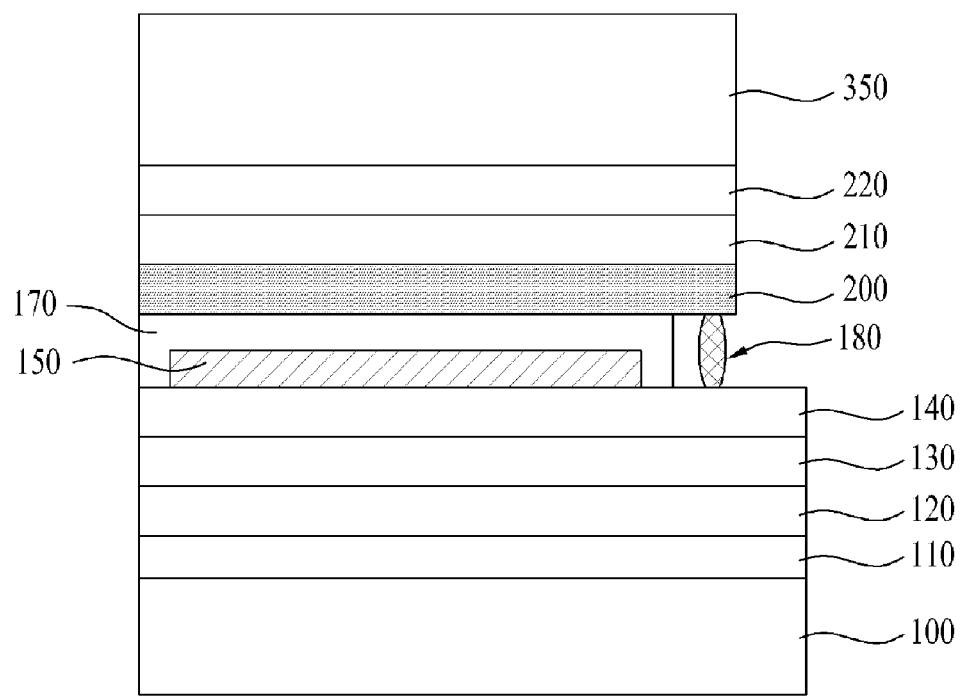

Thereafter, as shown in FIG. 3D, after the first substrate 300 is removed by etching or laser irradiation, the film substrate 100 is attached to the exposed rear surface of the first etch stopper layer 120. In this case, the adhesive layer 110 may be intervened between the film substrate 100 and the first etch stopper layer 120.

Figure 3E:
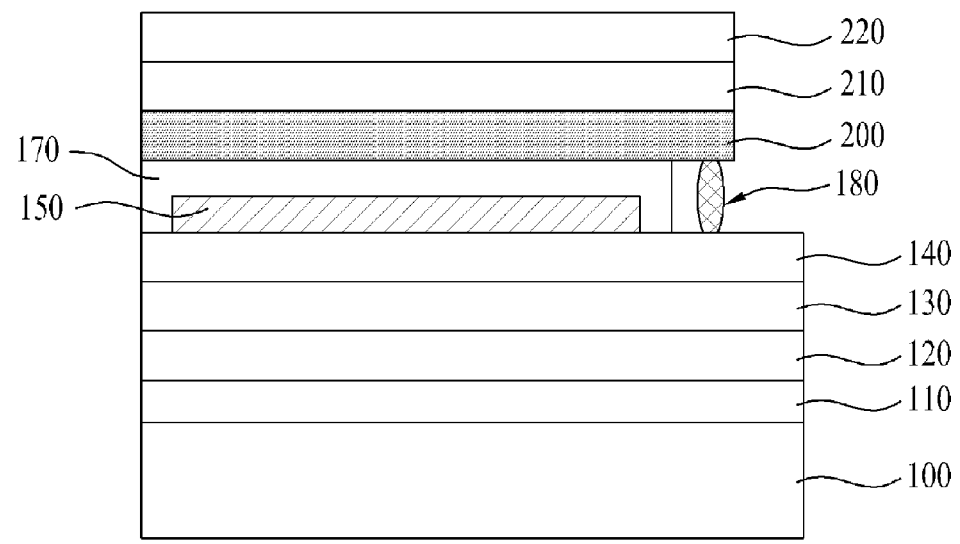

Thereafter, as shown in FIG. 3E, the second substrate 350 is removed by etching or laser irradiation. Methods of removal of the first substrate 300 and the second substrate 350 may be the same or may be different.

Then, the polarizing plate 230 is attached to the exposed surface of the second etch stopper layer 220, as shown in FIG. 2.

In some cases, after the process shown in FIG. 3D has been completed, the second substrate 350 may completely or partially remain and thus be used as a cover glass. In this case, a polarizing plate may be formed on the second substrate 350.

Hereinafter, with reference to the accompanying drawings, mounting of a circuit unit of the touch electrode layer and the thin film transistor array or the organic light emitting diodes will be described in detail.

Figure 4:
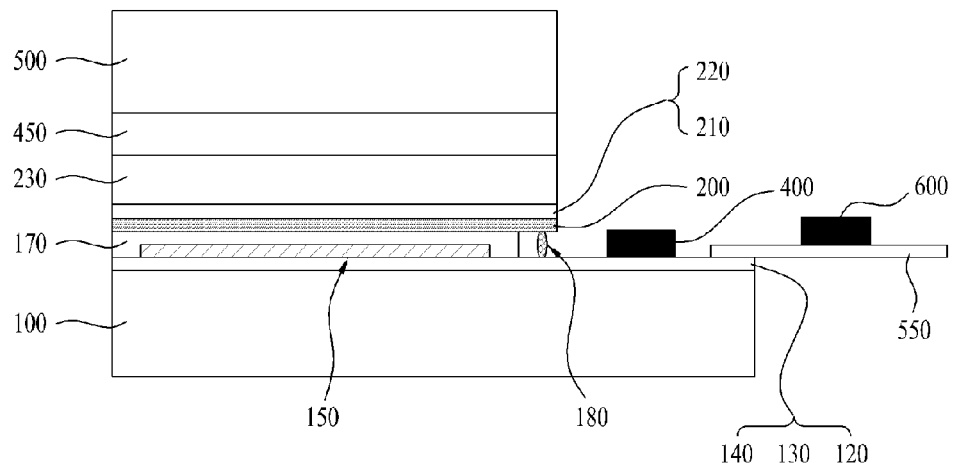
FIG. 4 is a cross-sectional view illustrating mounting of a circuit unit on the touch screen integrated organic light emitting display device in accordance with and one embodiment.
Figure 5:
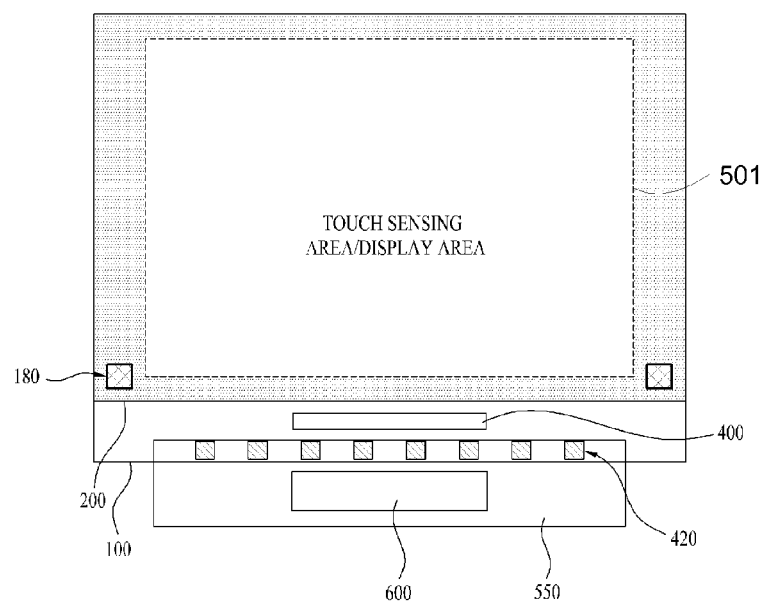
FIG. 5 is a plan view of FIG. 4.

FIG. 4 is a cross-sectional view illustrating mounting of the circuit unit on the touch screen integrated organic light emitting display device in accordance with one embodiment, and FIG. 5 is a plan view of FIG. 4.

As shown in FIGS. 4 and 5, in order to provide a drive circuit for the touch electrode layer and the thin film transistor array or the organic light emitting diodes, the first buffer layer 130 protrudes more outwardly than the touch electrode layer 200.

Further, a touch drive IC for transmitting and receiving signals to and from the first touch electrodes and the second touch electrodes and an OLED IC for transmitting signals to the thin film transistor array 140 and the organic light emitting diodes 150 are provided at the portion of the first buffer layer 130 protruding more outwardly than the touch electrode layer 200. Although FIGS. 4 and 5 illustrate the touch drive IC and the OLED IC as being integrated into one drive unit 400, the touch drive IC and the OLED IC may be separately provided, as needed.

If the touch drive IC is provided on the first buffer layer 130, as described above, mounting of a drive IC and a circuit on the touch electrode layer 200 may not be necessary and thus configuration of the touch electrode layer 200 may be simplified, and one circuit board may be omitted and thus a module process may be simplified.

Here, the touch drive IC and the OLED IC are connected to a flexible printed circuit board (FPCB) 550 formed at the edge of the portion of the first buffer layer 130 protruding more outwardly than the touch electrode layer 200.

A transparent cover 500 for protecting the touch screen may be formed on the polarizing plate 230 by intervening an adhesive layer 450 between the polarizing plate 230 and the transparent cover 500. In this case, the transparent cover 500 may be formed as a transparent insulating film or a glass so as not to increase the total thickness of the touch screen integrated organic light emitting display device. The transparent cover 500 may be omitted. In this case, the polarizing plate 230 may function to protect the touch screen. Further, in order to enhance the protection function, the thickness of the polarizing plate 230 may be variable, or the polarizing plate 230 may include a separate optical layer to prevent scattered reflection of external light in addition to the polarizing function.

As shown in FIGS. 4 and 5, the first buffer layer 130, the first etch stopper layer 120 and the film substrate 100 have the same first width, the touch electrode layer 200, the second buffer layer 210 and the second etch stopper layer 220 have the same second width, and the first width is greater than the second width. Herein, when the first etch stopper layer 120 having a first size and the second etch stopper layer 220 having a second size are formed as different rectangular shapes, the first size and the second size have same length and different widths.

Here, reference numeral 420 shown in FIG. 5 represents connection parts for connecting the touch drive IC and the OLED IC to FPCB 550, and pad electrodes and wiring connected to the pad electrodes are formed on the thin film transistor array 140 and are electrically connected to the touch drive IC and the OLED IC.

Further, reference numeral 600 shown in FIG. 5 represents a controller formed on the FPCB 550, and the controller 600 generates a signal transmitted to the touch drive IC and the OLED IC and stores/analyzes a signal sensed by the touch drive IC and the OLED IC.

The FPCB 550 may be folded to attach to the lower surface of the film substrate 100.

An area expressed by a dotted line 501 is a touch sensing area or a display area, pixels of the thin film transistor array 140 are located within the touch sensing area or the display area in a form of a matrix, and the pad parts are located at the outside of the touch sensing area or the display area.

The above-described touch screen integrated organic light emitting display device and method for fabricating the same in accordance with one embodiment have the following effects.

First, after the thin film transistor array 140 and the organic light emitting diodes 150 are formed on the first glass substrate and the touch electrodes are formed on the second glass substrate, the organic light emitting diodes 150 and the touch electrodes are opposite each other after the first glass substrate and the second glass substrate are bonded. And then both glass substrates, which are rigid, are removed, and a plastic film is attached to one of the surfaces which are exposed after removal of both the glass substrates, thereby achieving the thin profile and flexibility of the display device. The display device may be reduced to such a thickness as being bent and may be implemented as a flexible display device since the glass substrates, which are rigid and occupy the greatest thickness of the display device, are removed.

Second, the plastic film is attached after removal of the first glass substrate and a polarizing plate is formed after removal of the second glass substrate, thereby preventing the touch electrodes from being visible from the outside.

Third, the etch stopper layer and the buffer layer are formed on each of the first glass substrate and the second glass substrate prior to formation of the thin film transistor array 140 or the touch electrodes, thereby preventing the thin film transistor array 140, the organic light emitting diodes 150 or the touch electrodes from being corroded by a etching solution during removal of the glass substrates.

Fourth, the touch screen integrated organic light emitting display device in accordance with one embodiment may be formed as an in-cell type display device within which a touch screen is included.

Fifth, since the touch screen is included within the display device and the touch drive IC to drive the touch electrodes is provided on the thin film transistor array 140 protruding relatively outwardly, the touch drive IC and the OLED IC may be mounted on the same thin film transistor array 140 and connected to one flexible PCB, thereby simplifying circuit configuration.

Sixth, the touch screen integrated organic light emitting display device in accordance with one embodiment has a simplified configuration and reduces the number of steps of the method for fabricating the same, thereby improving yield and reducing cost.

It will be apparent to those skilled in the art that various modified embodiments and variations can be made in the present invention without departing from the spirit or scope of the invention. Thus, it is intended that the present invention covers the modified embodiments and variations of this invention provided they come within the scope of the appended claims and their equivalents.

What is claimed is:

1. A method for fabricating a touch screen integrated organic light emitting display device, comprising:
    sequentially forming a first etch stopper layer, a first buffer layer, a thin film transistor array including thin film transistors, organic light emitting diodes connected to the thin film transistors, and a passivation layer covering the thin film transistor array and the organic light emitting diodes on a first substrate;
    sequentially forming a second etch stopper layer, a second buffer layer, and a touch electrode layer on a second substrate;
    attaching the touch electrode layer to the passivation layer such that the touch electrode layer and the passivation layer are opposite each other;
    removing the first substrate and the second substrate; and
    attaching a film substrate to a surface of the first etch stopper layer which is exposed after the removal of the first substrate.

2. The method according to claim 1, further comprising attaching a polarizing plate to a surface of the second etch stopper layer which is exposed after the removal of the second substrate.

3. The method according to claim 1, wherein the step of removing the first substrate and the second substrate is carried out by etching or irradiating a laser to the first substrate and the second substrate.

4. The method according to claim 1, wherein the step of forming the first buffer layer and the second buffer layer is carried out by depositing at least one of an oxide layer and a nitride layer.

5. The method according to claim 1, wherein the first substrate protrudes more outwardly than the second substrate.

6. The method according to claim 5, wherein the step of forming the touch electrode layer includes forming first touch electrodes and second touch electrodes intersecting each other and touch pad electrodes respectively transmitting signals to the first and second touch electrodes.

7. The method according to claim 6, wherein, in the step of attaching the touch electrode layer to the passivation layer, the touch pad electrodes are connected to dummy metal formed in the same layer as the thin film transistor array.

8. The method according to claim 7, wherein the touch pad electrodes and the dummy metal are connected by applying a sealant including conductive metal balls.

9. The method according to claim 1, wherein the step of attaching the film substrate to the surface of the first etch stopper layer is carried out by intervening an adhesive layer between the first etch stopper layer and the film substrate.

10. The method according to claim 6, further comprising providing a touch drive IC (integrated circuit) and an organic light emitting diode (OLED) IC at a portion of the first buffer layer protruding more outwardly than the touch electrode layer, wherein the touch drive IC transmits and receives signals to and from the first touch electrodes and the second touch electrodes and wherein the OLED IC transmits signals to the thin film transistor array and the organic light emitting diodes.

11. The method according to claim 10, further comprising forming a flexible printed circuit at the portion of the first buffer layer protruding more outwardly than the touch electrode layer, wherein the flexible printed circuit is to be connected to the touch drive IC and the OLED IC.

12. The method according to claim 1, further comprising forming a transparent cover on the polarizing plate, wherein the transparent cover is formed of a plastic insulating film or a glass.

* * * * *